United States Patent [19]

Thayer et al.

[11] Patent Number: 5,734,971
[45] Date of Patent: Mar. 31, 1998

[54] ADAPTIVE SYSTEM FOR DETERMINING RADIO FREQUENCY AT VEHICLE START-UP

[75] Inventors: Peter Alan Thayer, Indianapolis; Morgan Daniel Murphy, Kokomo, both of Ind.

[73] Assignee: Delco Electronics Corporation, Kokomo, Ind.

[21] Appl. No.: 441,109

[22] Filed: May 15, 1995

[51] Int. Cl.⁶ .................................................. H04B 1/18
[52] U.S. Cl. .............................. 455/181.1; 455/186.1; 348/731
[58] Field of Search .......................... 455/184.1, 186.1, 455/186.2, 171.1, 181.1, 201.1, 234.1; 348/731, 732, 733

[56] References Cited

U.S. PATENT DOCUMENTS

| | | | |
|---|---|---|---|
| 4,635,121 | 1/1987 | Hoffman et al. | 358/188 |
| 4,879,699 | 11/1989 | Sakamoto | 368/63 |
| 4,954,899 | 9/1990 | Tanabe et al. | 358/191.1 |
| 5,081,707 | 1/1992 | Schorman et al. | 455/186 |
| 5,465,385 | 11/1995 | Ohga et al. | 455/6.1 |
| 5,511,724 | 4/1996 | Freiberger et al. | 236/49.3 |

FOREIGN PATENT DOCUMENTS 5599842  7/1980  Japan .

Primary Examiner—Reinhard J. Eisenzopf
Assistant Examiner—Darnell R. Armstrong
Attorney, Agent, or Firm—Jimmy L. Funke

[57] ABSTRACT

An adaptive learning system for adapting the frequency setting and volume level of a vehicle radio in response to a vehicle operator's preference of radio stations and volume levels for a particular time of day. A microprocessor is responsive to the frequency settings and volume level of the radio as set by the vehicle operator with respect to specific time intervals of the day. The microprocessor will establish a list of priority radio stations dependent on how often the vehicle operator selects the radio frequencies during each specific interval and an average volume level of the radio. The system will then automatically set the radio frequency and volume level based on the vehicle operator's priorities at vehicle start-up with respect to the current time of day.

6 Claims, 2 Drawing Sheets

ADAPTIVE SYSTEM FOR DETERMINING RADIO FREQUENCY AT VEHICLE START-UP

BACKGROUND OF THE INVENTION

1. Field of the invention

This invention relates generally to an adaptive learning system that sets a radio frequency and volume level of a vehicle radio and, more particularly, to an adaptive learning system that sets a vehicle radio frequency and volume level at vehicle start-up based on a vehicle operator's preference at particular times of day.

2. Discussion of the Related Art

Current technology in the manufacture of vehicles includes advancements directed to personalization of certain vehicle systems to a particular vehicle operator. One particular personalization advancement is an adaptive electronic climate control system as disclosed in U.S. patent application Ser. No. 08/344,189, filed Nov. 23, 1994, titled ADAPTIVE CLIMATE CONTROL SYSTEM, assigned to the assignee of the instant application, and herein incorporated by reference. This adaptive climate control system is an improvement of known electronic climate control systems that automatically control the climate within the passenger compartment of a vehicle based on a number of parameters that effect the climate. These parameters are initially preprogrammed and calibrated to a particular comfort level by a climate control calibration engineer at the manufacturing level of the vehicle.

The adaptive ECC system allows adjustments to the climate control system by a particular vehicle operator to teach the system to automatically be set to the operator's comfort level. For example, if the vehicle operator adjusts the temperature set point of the ECC system at a particular ambient air temperature, the system will store this change for that ambient air temperature. Once the change has been validated, the next time the system encounters that ambient air temperature, or an ambient air temperature around that ambient air temperature, the system will automatically provide the appropriate air mixture as previously set by the vehicle operator. Further, the adaptive ECC system will adapt the blower speed to the preference of the vehicle operator. Each time the vehicle operator adjusts the blower speed to a particular value, and the adaptive system validates the change in blower speed, the system will automatically readjust the blower speed for subsequent and environmental conditions sensed by the system.

The concept of adapting certain vehicle systems to a particular vehicle operator's preferences can be extended to other vehicle systems in addition to the vehicle climate control system. For example, another adaptive vehicle control system automatically adjusts the volume gain of a vehicle audio system in response to changes in vehicle speed, climate control mode and blower speed in connection with a vehicle operator's adjustment of the audio system volume level as disclosed in U.S. patent application Ser. No. (Attorney Docket No. H-181537), filed on or about the filing date of the instant application, titled ADAPTIVE SYSTEM FOR DETERMINING VOLUME GAIN FOR VEHICLE AUDIO SYSTEMS. Another adaptive system automatically sets the brightness level of an instrument display panel of a vehicle based on the ambient light intensity and the vehicle operator's preference as disclosed in U.S. patent application Ser. No. (Attorney Docket No. H-181538), filed on or about the filing date of the instant application, titled ADAPTIVE INSTRUMENT DISPLAY BRIGHTNESS CONTROL SYSTEM. Both of these applications are assigned to the assignee of the instant application, and are herein incorporated by reference. Still, other vehicle systems can benefit from these types of adaptive control systems.

Another area where an adaptive learning system could be useful is setting a particular radio frequency of a vehicle radio to a vehicle operator's preference at vehicle start-up. Often, vehicle operators select different radio stations of a vehicle radio based on the time of day. For example, a vehicle operator may prefer a news station in the morning on his way to work, but may prefer to unwind with a music station on his way home from work. An adaptive learning system can be employed that will learn the vehicle operator's preferences and associate these preferences with a time of day such that the system will automatically select a preferred frequency at vehicle start-up depending on the time of day. Further, the adaptive system can be extended to include selecting radio volume preferences based on the time of day, as well as other radio settings.

It is an object of the present invention to provide an adaptive learning system for selecting the radio frequency and volume of a vehicle radio at vehicle start-up depending on a vehicle operator's preferences.

SUMMARY OF THE INVENTION

In accordance with the teaching of the present invention, an adaptive learning system is disclosed that selects a particular radio frequency and volume level of a vehicle radio at vehicle start-up depending on a vehicle operator's preferences at a particular time of day. The adaptive system will periodically determine whether the vehicle has been turned on. When the vehicle is turned on and the radio is on, the system will retrieve from a memory a highest priority radio frequency and volume level previously set by the vehicle operator for a particular stored time interval of the day. The adaptive system will then monitor any changes the vehicle operator makes to the frequency setting and the volume level of the radio for each predetermined time interval so as to update a frequency priority list of the radio frequency and an average desired volume level of the preferences for the vehicle operator at each time interval. The adaptive system will store the frequency priority list and average volume level of the vehicle operator's preferences at each time of day interval such that if the vehicle is started at any of the time of day intervals, the system will be able to automatically set the radio frequency and volume level to the vehicle operator's preference.

Additional objects, advantages and features of the present invention will become apparent from the following description and appended claims, taken in conjunction with the accompanying drawings.

DETAILED DESCRIPTION OF THE PREFERRED EMBODIMENTS

The following discussion of the preferred embodiments concerning an adaptive system for selecting a preferred radio frequency and volume level at vehicle start-up is merely exemplary in nature, and is in no way intended to limit the invention or its application or uses.

Figure 1:
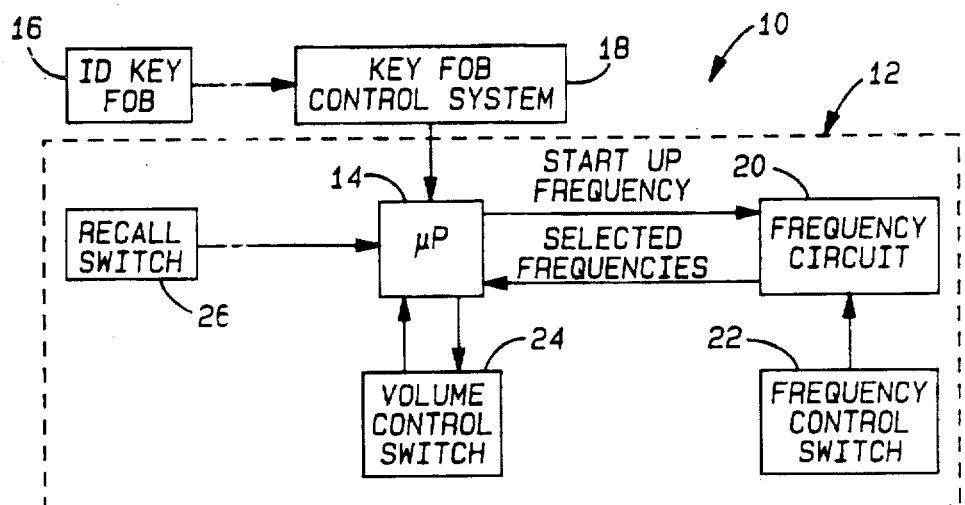
FIG. 1 is a general block diagram of an adaptive learning system for selecting preferred radio frequencies and volume levels at vehicle start-up depending on time of day according to an embodiment of the present invention.

FIG. 1 shows a general block diagram of an adaptive system 10 that automatically selects a particular radio frequency and volume level of a vehicle radio 12 within a vehicle (not shown) at vehicle start-up, based on a vehicle operator's preference at a particular time of day. In the embodiment being disclosed, the system 10 is limited to setting the radio frequency and volume level at vehicle start-up because it would be annoying to the vehicle operator if the system 10 automatically adjusted the radio frequency and volume level while the vehicle radio 12 was in use. The system 10 is microprocessor controlled by a microprocessor 14. From the discussion below, one skilled in the art would be able to program the microprocessor 14 to perform the desired functions.

In order to determine which of possibly several different vehicle operators will operate the vehicle so as to select the radio frequency and volume level based on that operator's preferences, as well as independently update the preferred radio frequency and volume level for each of several operators, a vehicle operator identification (ID) key fob 16 is provided that transmits an identification code to a key fob control system 18 to identify a particular vehicle operator. For a more detailed discussion of identifying a vehicle operator in conjunction with an adaptive learning system, see U.S. patent application Ser. No. (Attorney Docket No. H184878), filed on or about the filing date of the instant application, titled SYSTEM FOR VERIFYING DRIVER ID, assigned to the assignee of the instant application and herein incorporated by reference. The key fob control system 18 transmits a signal indicative of an operator ID to the microprocessor 14. ID key fobs and control systems which transmit and decipher a particular code from a key fob as a vehicle operator approaches a vehicle are well known in the art. Typically, these types of key fobs will transmit a function code along with the ID code to cause the vehicle to perform certain functions remotely from the vehicle, such as setting an alarm system, or locking or unlocking the vehicle doors. Of course, as will be appreciated by those skilled in the art, other systems for identifying a vehicle operator can be used without departing from the scope of the invention.

Once the microprocessor 14 receives the identification code of a particular operator, and the vehicle is turned on and the radio 12 is turned on, the microprocessor 14 will transmit a highest priority start-up frequency signal for the particular time of day to a frequency circuit 20 of the radio 12 to establish an initial start-up radio frequency based on a priority frequency list stored in a memory (not shown) of the microprocessor 14 if the vehicle has been off for a predetermined period of time. The microprocessor 14 will transmit the appropriate frequency depending on the time of day from a clock (not shown) internal to the microprocessor 14. The frequency circuit 20 transmits a current selected frequency signal to the microprocessor 14 in response to manual changes of a frequency control switch 22 by the vehicle operator that changes the frequency setting of the frequency circuit 20 in order to update the frequency priority list. The priority list of radio frequencies becomes important because radio frequencies that are high priority, but not the highest priority, can be moved to the highest priority position more readily. In this manner, the microprocessor 14 monitors the changes to the frequency setting of the radio 12 made by the operator so as to update the operator's preferences.

The microprocessor 14 also transmits a volume control signal to a volume control switch 24 associated with the radio 12 to set a volume level of the radio 12 at vehicle start-up. This volume control signal is also time of day sensitive. Any manual adjustments to the volume control switch 24 by the vehicle operator are transmitted to the microprocessor 14 so that the microprocessor 14 can calculate and store an average volume level of the vehicle operator's preference at that time of day. In this manner, the microprocessor 14 updates a preferred volume level setting of the vehicle operator. A discussion of adapting vehicle radio volume to a vehicle operator's preference can be found in the application titled ADAPTIVE SYSTEM FOR DETERMINING VOLUME GAIN FOR VEHICLE AUDIO SYSTEMS referenced above. A recall switch 26 transmits a recall signal to the microprocessor 14 so that the vehicle operator can switch the frequency back to a previous frequency. For example, if the vehicle operator is listening to one radio station at one time interval and wishes to get this station back at a subsequent time interval after vehicle start-up, the recall switch 26 allows this to be accomplished.

Figure 2A:
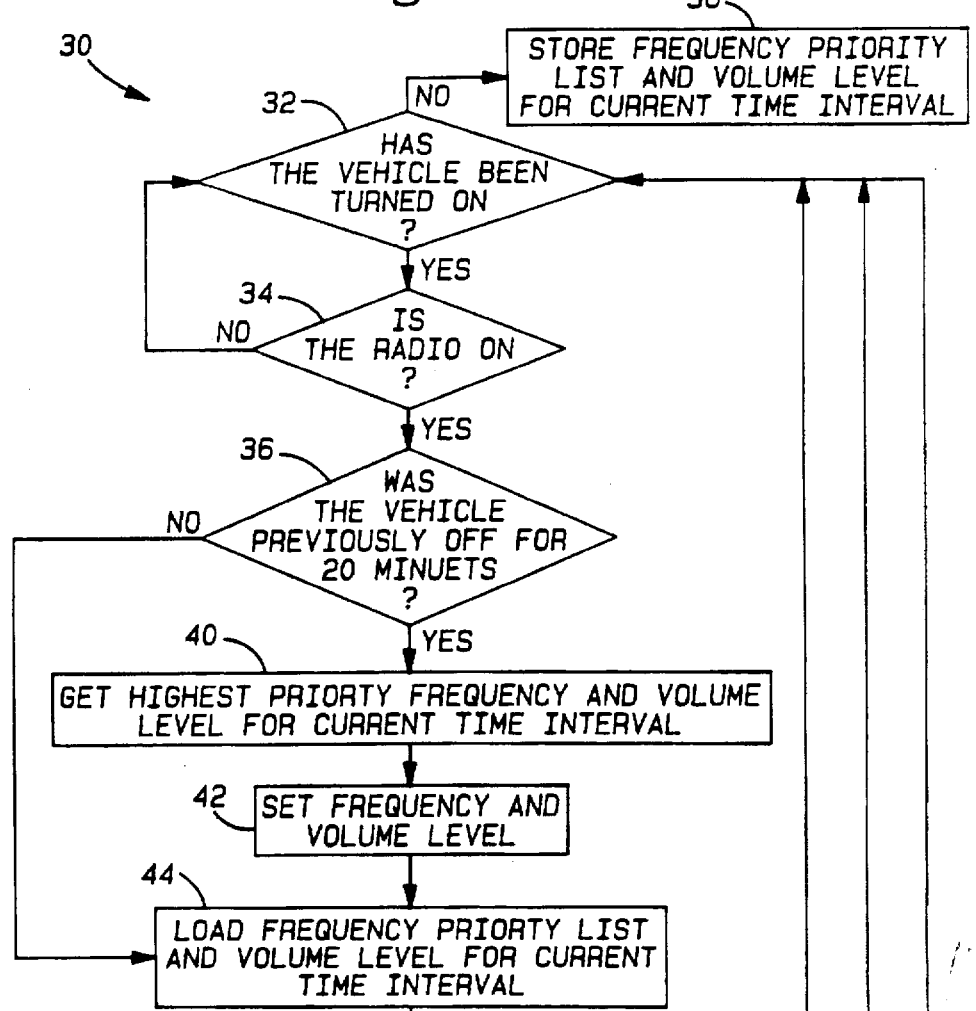
FIGS. 2a–2b is a detailed block diagram of the adaptive system of FIG. 1.
Figure 2B:
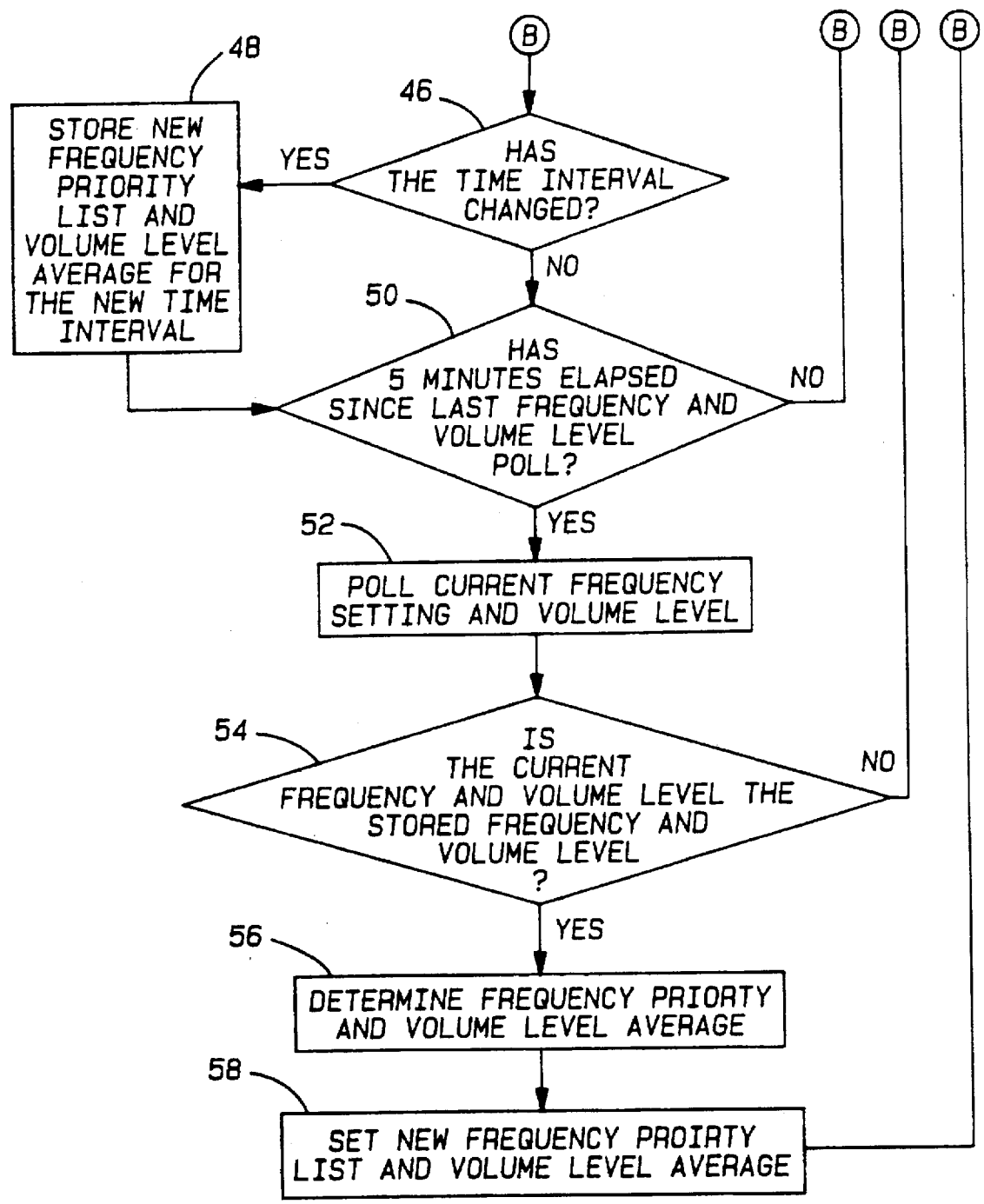

FIGS. 2a–2b show a detailed flow chart diagram 30 depicting the operation of the adaptive system 10 discussed above. The microprocessor 14 controls the operation of the system 10 by monitoring a number of events. The system 10 will periodically determine whether the vehicle has been turned on, as represented by box 32. If the vehicle has been turned on, the system 10 will then determine if the radio 12 is on, as represented by box 34. The microprocessor 14 will continually monitor whether the vehicle and radio 12 are on or off for the entire process discussed below in a manner that will allow the system 10 to immediately set a preferred frequency setting and volume level at vehicle start-up as discussed below.

If the vehicle has not been turned on at the box 32, then the system 10 will store a current priority list of radio frequencies and an average radio volume level for the current time of day interval as previously set by the vehicle operator and stored in a memory in the microprocessor 14, as represented by box 36. The microprocessor 14 determines what the priority of preferred radio stations is by monitoring changes to the frequency circuit 20 made by the vehicle operator when actuating the frequency switch 22 during a particular time interval. The microprocessor 14 determines the volume level by calculating an average volume level of the volume level changes made by the operator when actuating the switch 24 for each time interval. In one embodiment, the microprocessor 14 will store five radio frequencies in order of descending priority, and separate the day into two hour intervals. Of course, it is entirely within the scope of the present invention to set the microprocessor 14 to store any number of radio frequencies, preferably on the order of between one and twenty-five radio frequencies, and separate the day into any desirable time intervals, such as time intervals of thirty minutes to six hours, or any other appropriate time interval for any related application. Further, it may be desirable to provide a switch (not shown) that allows the vehicle operator to adjust the number of stored radio frequencies and time interval as may be desired by any vehicle operator.

If the radio is on at the box 34, the system 10 will determine whether the vehicle has been off for more than a predetermined interval of time, here twenty minutes, before the vehicle was turned on at the box 32, as represented by box 38. This time interval prevents the system 10 from changing the previous frequency setting and volume level of the radio 12 if the vehicle operator has been away from the vehicle only for a short period of time. If the vehicle has been off for more than twenty minutes, the system 10 will retrieve the highest priority radio frequency and volume level for the current time interval from the memory in the microprocessor 14 at box 40. Of course, other time intervals of more or less than twenty minutes may be used if better for a specific application. For example, it may be desirable to reset the time the vehicle has been off to other time intervals such as five minutes or sixty minutes, or any time interval between five minutes and sixty minutes or outside of that range. Further, it may be desirable to provide a switch (not shown) that allows the vehicle operator to select that time interval should be or is most desirable.

Once the system 10 selects the highest priority radio frequency and volume level that is stored for the current time interval, the system 10 will set the frequency circuit 22 and the volume switch 24 accordingly, as represented by box 42. The system 10 will then load a stored frequency priority list and average volume level for the current time interval at box 44 so that any changes the operator makes to the frequency switch 22 and/or the volume switch 24 can be used to update the priority list and stored volume level as will be discussed in greater detail below. If the vehicle was not off for 20 minutes at the box 38, then the system 10 will return the previous frequency setting and volume level, and will load the priority list and volume level for the current time of day interval to be updated. Changes that the vehicle operator makes to the frequency switch 22 and the volume switch 24 is another event that the system 10 monitors.

As the system 10 continually monitors changes that the vehicle operator has made to the radio frequency and volume level so as to update the frequency priority list and average volume, the system 10 also continues to monitor whether the particular time of day interval has changed, as represented by box 46. If the time of day interval has changed, then the system 10 will update the frequency priority list and volume level average to a new frequency priority list and volume level average for the new time of day interval, as represented by box 48. The system 10 does not change the selected radio frequency and volume level as currently set if the radio 12 is on. However, the system 10 updates the new frequency priority list and volume level with respect to changes made by the vehicle operator so that if the vehicle is turned on during this time interval at a later date, the system 10 will be updated to the vehicle operator's preferences.

If the time interval has not changed or if the new priority list and volume level average are stored, then the system 10 will determine if a predetermined time limit, here 5 minutes, has expired since the last time the system 10 determined if the radio frequency and/or volume level has been changed by the vehicle operator, as represented by box 50. If the five minute interval has not expired, the system 10 will return to the event of determining if the vehicle is on at the box 52. However, if the five minute interval has expired, the system 10 will determine what the current frequency and volume level of the radio 12 is at box 52. In this manner, the system 10 only monitors changes to the frequency setting and volume level periodically. Of course, other time intervals than that of five minutes can be used if desired.

The system 10 will then determine if the current radio frequency is the frequency that is currently at the highest priority position in the list or if the current frequency changes the priority list as represented by box 54. The system 10 will also determine if the current volume level changes the average volume level for the current time interval at the box 54. If the current frequency setting and volume level do change the frequency priority list and the volume level average, then the system 10 will determine a new frequency priority list and average volume level at box 56, and set a new priority list and volume level average at box 58. The system 10 continues to update the frequency priority list and average volume level for each time interval for a plurality of different vehicle operators when the vehicle radio 12 is on in this manner. Of course, as would be appreciated by one skilled in the art, the system need not monitor and adjust both the frequency setting and volume level in that the system 10 can perform the tasks independently of one another.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

The embodiments of the invention in which an exclusive property or privilege is claimed are defined as follows:

1. A system for establishing a frequency setting of a vehicle radio at vehicle start-up, said system comprising:

a frequency switch, said frequency switch operable to set radio frequencies of the vehicle radio; and a control device, said control device automatically setting a predetermined frequency of the radio for a plurality of predetermined time intervals at vehicle start-up, wherein each time interval is a range of consecutive times, said control device being responsive to the frequencies set by the frequency switch during each of the time intervals, said control device establishing a list of priority frequency settings including a high priority frequency in response to the frequencies set by the frequency switch for each of the plurality of time intervals based upon the frequency setting of the frequency switch so as to establish the predetermined frequency to be set at vehicle start-up, wherein the control device prevents the system from automatically setting a predetermined frequency if the vehicle has been off less than a predetermined time limit.

2. The system according to claim 1 further comprising a volume switch, said volume switch operable to adjust a volume level of the vehicle radio, said control device being responsive to a position of the volume switch, said control device determining an average volume level for each of the plurality of time intervals from the position of the volume switch so as to automatically establish a predetermined volume level setting of the vehicle radio at vehicle start-up.

3. The system according to claim 1 wherein the control device establishes a list of priority frequencies for each of the plurality of predetermined time intervals with respect to the time of day.

4. The system according to claim 1 wherein the control device determines the frequency of the vehicle radio at regular predetermined intervals so as to update the list of priority frequencies based on frequency changes made by the frequency switch.

5. The system according to claim 1 wherein the control device is responsive to a plurality of identification codes so as to identify a plurality of vehicle operators.

6. The system according to claim 5 further comprising a key fob transmitter that transmits the identification codes to the control device.

* * * * *